United States Patent
Christensen et al.

(10) Patent No.: US 6,303,457 B1
(45) Date of Patent: *Oct. 16, 2001

(54) INTEGRATED CIRCUIT HAVING INTEGRAL DECOUPLING CAPACITOR

(76) Inventors: Todd Alan Christensen, 2410 23rd St. NW., Rochester, MN (US) 55901; John Edward Sheet, II, 46505 160th Ave., Zumbrota, MN (US) 55992

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/890,047

(22) Filed: Jul. 9, 1997

Related U.S. Application Data

(62) Division of application No. 09/600,533, filed on Feb. 13, 1996, now Pat. No. 5,872,697.

(51) Int. Cl.[7] .................................................. H01L 21/20
(52) U.S. Cl. ............................................ 438/396; 438/399
(58) Field of Search ................................. 438/381, 396, 438/399, 239, 253, 256

(56) References Cited

U.S. PATENT DOCUMENTS

| | | |
|---|---|---|
| 4,423,087 | 12/1983 | Howard et al. . |
| 4,439,813 | 3/1984 | Dougherty et al. . |
| 4,471,405 | 9/1984 | Howard et al. . |
| 4,638,400 * | 1/1987 | Brown et al. . |
| 4,945,399 | 7/1990 | Brown et al. . |
| 5,134,539 | 7/1992 | Tuckerman et al. . |
| 5,208,725 | 5/1993 | Akcasu . |
| 5,254,493 * | 10/1993 | Kumar . |
| 5,272,600 | 12/1993 | Carey . |
| 5,310,695 * | 5/1994 | Suzuki . |
| 5,394,294 * | 2/1995 | Mei et al. . |
| 5,563,762 * | 10/1996 | Leung et al. . |
| 5,583,739 * | 12/1996 | Vu et al. . |
| 5,587,333 * | 12/1996 | Johansson et al. . |
| 5,589,707 * | 12/1996 | Cronin . |
| 5,635,421 * | 6/1997 | Ting . |

FOREIGN PATENT DOCUMENTS

| | | |
|---|---|---|
| 56-62354 | 5/1981 | (JP) . |
| 6-252362 | 9/1994 | (JP) . |

OTHER PUBLICATIONS

S.M.Sze, VLSI technology, 2nd edition, pp 268, 1988.*

IBM Technical Disclosure Bulletin, vol. 34, No. 8, Jan. 1992, Dhong et al., Method of Increasing On–Chip VDD Decoupling Capacitance Using a Shielded Micro–Strip Structure, pp. 59–60.

IBM Technical Disclosure Bulletin, vol. 37, No. 10., Oct. 1994, Beach et al., "High Dielectric Constant On–Chip Decoupling Capacitor Incorporated into BEOL Fabrication Process," pp. 413.

IBM Technical Disclosure Bulletin, vol. 38, No. 01, Jan. 1995, Dinger et al., "Controlled Impedance Very Large Scale Integration Interconnects with On–Chip Decoupling Capacitors," pp. 373–375.

* cited by examiner

Primary Examiner—Tuan H. Nguyen
Assistant Examiner—Scott J. Hawranek

(57) ABSTRACT

The present invention is a decoupling capacitor for an integrated circuit. The integrated circuit has a final metal layer which includes a power bus. The decoupling capacitor comprises a dielectric film disposed over the final metal layer and a conductive film disposed over the dielectric layer, whereby capacitance may be provided in the dielectric layer.

11 Claims, 5 Drawing Sheets

INTEGRATED CIRCUIT HAVING INTEGRAL DECOUPLING CAPACITOR

This is a Divisional of application Ser. No. 08/600,533, filed Feb. 13, 1996, U.S. Pat. No. 5,872,697, which application(s) are incorporated herein by reference.

FIELD OF THE INVENTION

The present invention relates generally to the design and fabrication of integrated circuit (IC) chips, and, more particularly, to IC chips having decoupling capacitance.

BACKGROUND OF THE INVENTION

As silicon device geometries shrink, IC chip densities and speed performance improve considerably. Systems with these devices switch in subnanosecond times with further advances in chip densities and performance being expected. This high speed switching results in high transient currents which cause supply voltage variations, generally known as power supply bounce. In response, decoupling capacitors have generally been used to isolate the devices from the power supply bounce.

Decoupling capacitors have been provided on chip carriers, modules which carry multiple IC chips. See, e.g., U.S. Pat. No. 5,134,539 to Tuckerman et al. and U.S. Pat. No. 4,675,717 to Herrero et al. However, due to the rapidly shrinking sizes and rapidly increasing speeds of integrated circuits, chip carrier decoupling capacitors do not sufficiently reduce or isolate the power supply bounce on the IC chips which it carries. Off-chip decoupling capacitors have been provided with wiring directly to the IC chip. However, the long wire connections have high resistance which necessarily limits the effectiveness of this capacitance due to the excessively large time constant. Also this technique leads to high costs due to discrete capacitor substrate complexity and assembly cost.

On-chip solutions have been attempted by fabricating parallel plate capacitor structures using two or more metal layers of an integrated circuit. For example, in Beach et al., High Dielectric Constant On-Chip Decoupling Capacitor Incorporated Into BEOL Fabrication Process, IBM Technical Disclosure Bulletin, October 1994, a decoupling capacitor is built between the final metal layer and the underlying metal layer. In U.S. Pat. No. 5,208,725 to Akcasu, an integral decoupling capacitor consisting of two sets of parallel conducting strips formed by the existing layers of an integrated circuit is disclosed. These techniques use significant numbers of metal wires that could otherwise be used for signal or logic wiring. A third decoupling capacitor fabrication technique utilizes structures built with gate oxide capacitors. These capacitors occupy a large silicon area of a chip and are prone to stress failure, thereby limiting yield and/or reliability. For example, if the oxide layer is not as thick as desired, a stress point may develop and, with time, cause the chip to fail. In addition, the oxide layer may have a thin hole or other defect which could cause the chip to fail immediately. Thus, these decoupling capacitors are inefficient and expensive.

There is an intensely felt need in the integrated circuit industry to provide a low cost and highly reliable integrated circuit having an integral decoupling capacitor. The present invention addresses this need as well as other needs.

SUMMARY OF THE INVENTION

The present invention is a decoupling capacitor for an integrated circuit. The integrated circuit has a final metal layer which includes a power bus. The decoupling capacitor comprises a dielectric film disposed over the final metal layer and a conductive film disposed over the dielectric layer, whereby capacitance may be provided in the dielectric layer.

DETAILED DESCRIPTION OF THE EMBODIMENTS

Figure 1:
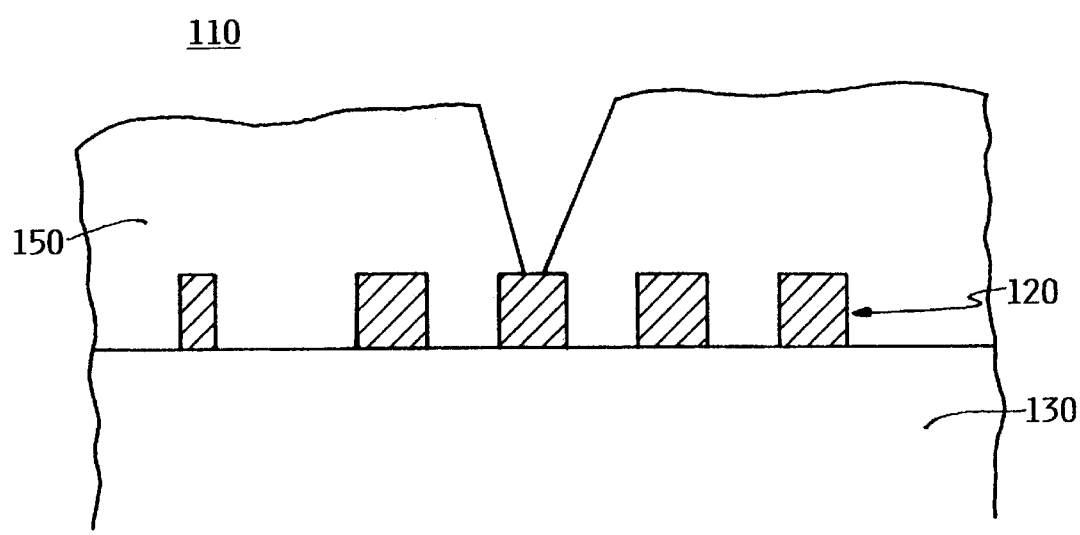
FIG. 1 is a cross-sectional view of the uppermost layers of a conventional IC chip.

Referring now to the drawings, and more particularly to FIG. 1, there is shown a cross-sectional view of the uppermost layers of a conventional integrated circuit (IC) chip 110. As will be appreciated by those skilled in the art, a conventional IC chip 110 typically includes a number of layers, including a number of metal layers. The uppermost layers, as shown in FIG. 1, include a final metal layer 120 deposited on a dielectric layer 130. The final metal layer 120 typically carries both signal wires and power distribution wires (power buses). Deposited over the final metal layer 120 may be an overcoat layer 150, typically silicon dioxide, silicon nitride, and/or a polymer. Though the lower layers of the IC chip 110 are typically mechanically polished to a flat surface, the final metal layer 120 is not. Thus, in conventional IC chips 110, the overcoat layer 150 is deposited over a varying topography.

Figure 3A:
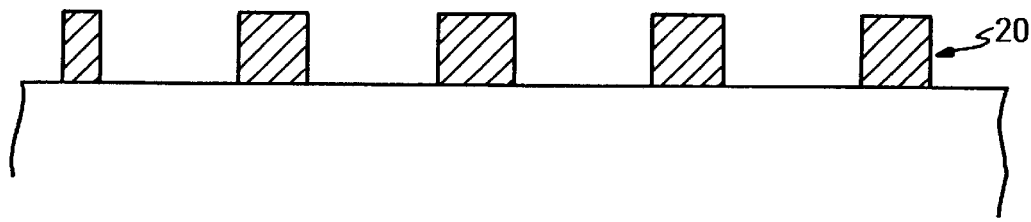
FIGS. 3A–3D are cross-sectional views at various stages of an exemplary fabrication process for forming an integrated circuit having a decoupling capacitor.
Figure 3B:
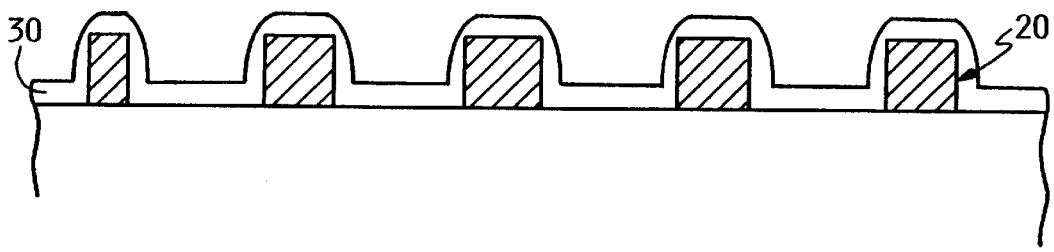
Figure 3C:
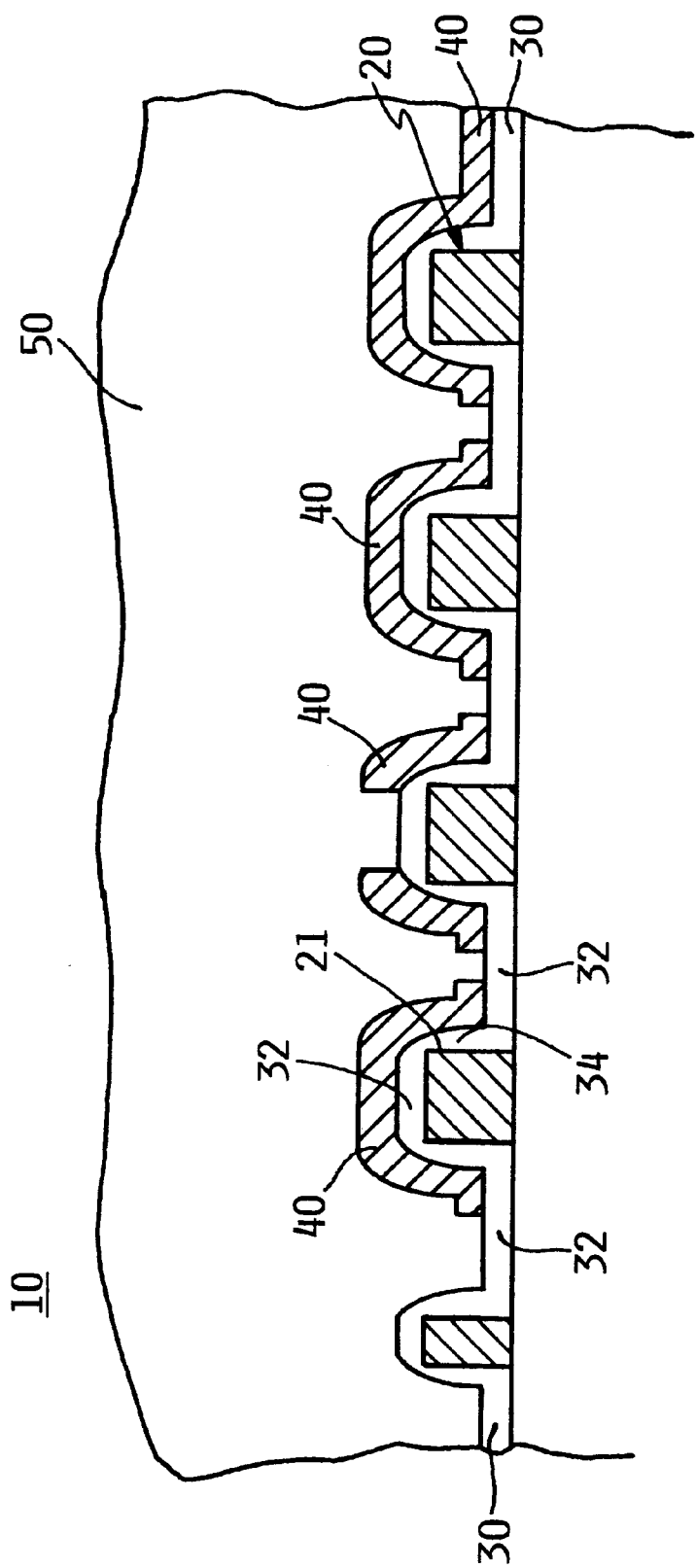
Figure 3D:
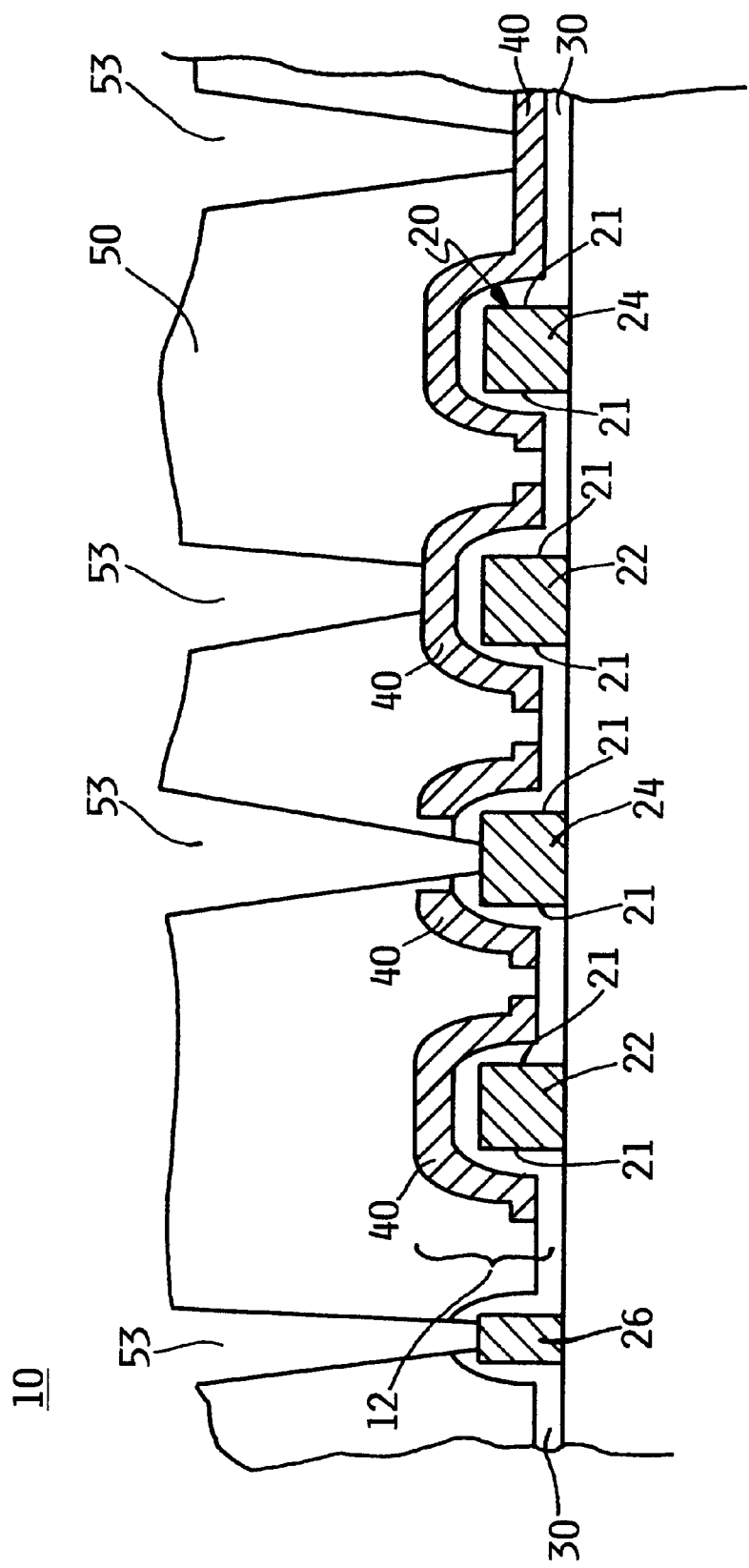

Turning now to FIG. 3D, there is illustrated an exemplary IC chip 10 having an integral decoupling capacitor, generally designated 12, formed between its final metal layer 20 and an overcoat layer 50. The final metal layer 20 typically comprises a plurality of signal wires 26 and power buses 22, 24. The power buses are typically aluminum and include ground buses 22 which are connected to a ground source, e.g. 0 Volts (V), and voltage supply buses 24, each of which are connected to a voltage source, e.g. 2.5 V, 3.3 V, 5.0 V, etc. For purposes of clarity, only a limited area of the IC chip 10 is depicted in the drawings.

The decoupling capacitor 12 comprises a dielectric film 30 disposed between the final metal layer 20 and a conductive film 40. The final metal layer 20 forms one plate of the decoupling capacitor 12 while the conductive film 40 forms the other. As will be explained more fully hereinafter, the conductive film 40 may be selectively patterned over the surface of the IC chip 10 so as to allow connections to the underlying final metal layer 20 and to form decoupling capacitance only where desired.

The provision of capacitance directly above the final metal layer 20 enhances the performance of IC chips. For example, the wire connections to the capacitor plates are shorter than the wire connections in off-chip decoupling capacitors. Thus, the decoupling capacitor 12 allows higher switching speeds in IC chips by providing faster response to power supply bounce resulting from the large currents required by high speed switching.

Referring now to FIGS. 3A through 3D, there is illustrated an exemplary process for fabricating an IC chip 10 having an integral decoupling capacitor 12. Using conventional prior process steps, the final metal layer 20 is deposited and defined on the IC chip 10. The structure of the IC chip 10 at this stage is shown in FIG. 3A.

Referring now to FIG. 3B, a dielectric film 30 is disposed over the final metal layer 20. The dielectric film 30 may be placed over a mechanically polished surface exposing the final metal layer 20. In the exemplary embodiment, however, the final metal layer 20 is not polished, as polishing adds a process step, and, more importantly, a non-polished surface enables the decoupling capacitor 12 to take advantage of the sides 21 of the final metal layer 20 wires to increase the capacitance as will be described more fully hereinafter. The dielectric film 30 is a relatively high dielectric constant material, typically silicon nitride or silicon oxide, or another frequently used material such as a polyimide or other polymer. The dielectric film 30 may be disposed over the final metal layer using a number of techniques, including evaporation, sputtering, or chemical vapor deposition. In the exemplary embodiment, the dielectric film 30 comprises silicon nitride, deposited by chemical vapor deposition. Silicon nitride provides a relatively high dielectric constant and reliable performance.

The dielectric film 30 may be deposited to a substantially uniform thickness over the surface of the IC chip 10 and should sufficiently cover the final metal layer 20 so as to avoid the formation of voids which may cause shorting of the final metal layer 20 wires after the conductive film 40 is applied. It is noted that the uniform thickness may vary somewhat as a result of deposition over a varying topography. For example, as illustrated in FIG. 3C, the dielectric film 30 may be thicker on flat surfaces 32 on top of and between final metal wires than on side wall surfaces 34 adjacent the sides 21 of the final metal wires.

Figure 2:
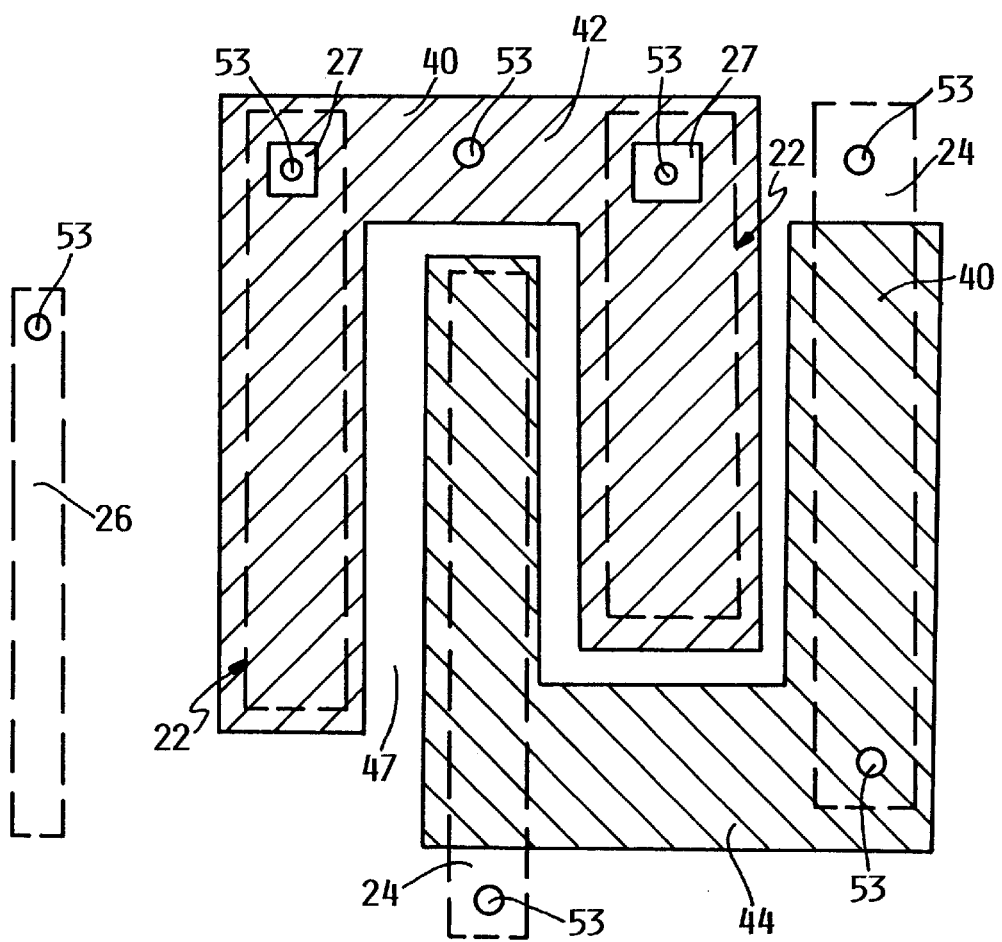
FIG. 2 is a top schematic view of an integrated circuit having a decoupling capacitor in accordance with an exemplary embodiment of the present invention.

As noted above, the conductive film 40 is selectively placed over the surface of the IC chip 10. In the exemplary embodiment, the conductive film 40 is deposited over substantially all of the surface of the IC chip 10, for example, by evaporation or sputtering. Then, using photolithographic techniques, the conductive film 40 is etched to remove the conductive film 40 where desired. As best shown in FIGS. 2 and 3B, the conductive film 40 is selectively etched from the areas around the signal wires 26 and also etched to form gaps 27 over portions of the final metal layer 20. The conductive film 40 is not disposed over the signal wires 26, because capacitance impedes the switching of the signal wires 26. The etched gaps 27 are provided to enable the final metal layer 20 to be connected to a power source as more fully described hereinbelow.

To form a decoupling capacitor 12, the conductive film 40 is connected to a supply voltage opposite that of an underlying power bus 22, 24. In the exemplary embodiment shown in FIG. 2, the conductive film 40 comprises two conductive strips 42, 44, one strip 42 being disposed above ground buses 22 and connected to a voltage supply source, the other strip 44 being disposed above voltage supply buses 24 and connected to ground. The use of two conductive strips is by way of example, not of limitation. For example, each power bus or grouping thereof could be associated with a conductive strip connected to an opposite supply voltage.

To form the conductive strips 42, 44, the conductive film 40 may be etched as shown in FIG. 2, with gaps 47 isolating and defining the conductive strips. The resulting conductive film 40 substantially covers all of the power buses 22, 24 of the final metal layer 20, but the etched gaps 27 which are used for terminal connections to the final metal layer 20. However, it should be appreciated that terminal connections represent less than 1 percent (%) of the area of an IC chip whereas the final metal layer 20 covers a substantial portion, e.g. 70–75%, of the chip.

In the exemplary embodiment, the conductive film 40 is deposited over a non-polished dielectric film 30. This allows the conductive film 40 to surround the sides 21, as well as the top, of the final metal wires. This presents a three-sided capacitor with increased surface area and thus increased capacitance.

After the conductive film 40, i.e., the top plate of the decoupling capacitor 12, has been formed, an overcoat layer 50, typically silicon nitride silicon dioxide and/or a polymer, may be deposited by conventional means, e.g., by chemical vapor deposition. At this point, the structure of the IC chip 10 is as shown in FIG. 3C. Next, openings are provided through the overcoat layer to establish vias 53 which connect power sources to the conductive film 40 and the power buses 22, 24 and signal wires 26 of the final metal layer 20. A top schematic view and a side, cross-sectional view of portions of exemplary final structures are shown in FIGS. 2 and 3D. Vias 53 which connect the power buses 22, 24 are provided through the etched gaps 27 formed in the conductive film 40.

In an exemplary embodiment of the present invention, the dielectric film 30 has a flat surface 32 thickness on the order of 1500 A and a side wall 34 thickness on the order of 1100 A. It is noted that the dielectric film 30 may have any thickness, with thinner films being less reliable and thicker films generally not providing sufficient capacitance per unit area.

The conductive film 40 may have a thickness on the order of 2000 A. The conductive film 40 thickness may range from 1000 A and upward, though thinner films 40 result in more resistance. In the exemplary embodiment, the thickness of the conductive film 40 is limited by the distance between the power buses 22, 24. As will be appreciated by those skilled in the art, the overall decoupling capacitance provided by the present invention varies with the number and size of the power buses 22, 24, with IC chips having more, narrower buses 22, 24 providing higher decoupling capacitance.

The integral decoupling capacitor of the present invention, in addition to enhancing chip performance, reduces the cost of the packaged chip relative to chips incorporating other decoupling techniques. The integral decoupling capacitor 12 may replace existing gate level capacitors, increasing reliability and reducing silicon area, and thus reducing cost. The decoupling capacitor 12 may also be used in conjunction with existing gate level capacitors and/or external decoupling capacitors, if so desired. In the latter instance, if an existing chip design lacks sufficient decoupling capacitance, an integral decoupling capacitor 12 may be easily incorporated into the manufacturing process without requiring a redesign of the underlying layers of the IC chip and/or the bulk of the manufacturing process.

It will, of course, be understood that various modifications and additions can be made to the embodiments discussed herein above without parting from the scope or spirit of the present invention. For example, the integral decoupling capacitor may be employed on other devices, such as chip-carrying substrates. Accordingly, the scope of the present invention should not be limited to the particular embodiments discussed above, but should be defined only by full and fair scope of the claims set forth below.

What is claimed is:

1. A method of forming an integral decoupling capacitor for an integrated circuit device, comprising the steps of:

providing an integrated circuit device base having a substrate;

forming a final metal layer directly over the substrate, the final metal layer including a plurality of power busses acting as at least one first capacitor plate and a plurality of signal wires, wherein the plurality of signal wires are electrically isolated from the plurality of power busses;

placing a dielectric film over the final metal layer; and placing a conductive film over the dielectric film, acting as at least one second capacitor plate, wherein the integral decoupling capacitor is formed over the plurality of power busses.

2. The method of forming an integral decoupling capacitor of claim 1, further comprising the step of placing an overcoat layer over the conductive film.

3. The method of forming an integral decoupling capacitor of claim 2, further comprising the step of forming vias to enable connections to the conductive film and the final metal layer.

4. The method of forming an integral decoupling capacitor of claim 1, wherein the dielectric film covers substantially all of the final metal layer of the integrated circuit.

5. The method of forming an integral decoupling capacitor of claim 1, wherein the step of placing the dielectric film comprises depositing the dielectric film by chemical vapor deposition.

6. The method of forming an integral decoupling capacitor of claim 1, wherein the dielectric film is formed to comprise silicon nitride.

7. The method of forming an integral decoupling capacitor of claim 1, wherein the conductive film is formed to cover the top and sides of the plurality of power busses.

8. The method of forming an integral decoupling capacitor of claim 1, wherein the conductive film is formed to comprise at least two conductive strips.

9. The method of forming an integral decoupling capacitor of claim 1, wherein the final metal layer is formed to include signal wires; and the conductive film is formed so that it does not cover the plurality of signal wires.

10. The method of forming an integral decoupling capacitor of claim 1, wherein the step of placing the conductive film comprises sputtering the conductive film.

11. The method of forming an integral decoupling capacitor of claim 1, wherein the conductive film is formed to comprise aluminum.

* * * * *

UNITED STATES PATENT AND TRADEMARK OFFICE
CERTIFICATE OF CORRECTION

PATENT NO. : 6,303,457 B1
DATED : October 16, 2001
INVENTOR(S) : Todd Alan Christensen and John Edward Sheets, II It is certified that error appears in the above-identified patent and that said Letters Patent is hereby corrected as shown below:

<u>Title page,</u>
Item [76], "John Edward Sheet, II" should read -- John Edward Sheets, II --
Item [73] is missing, please add -- Assignee: International Business Machines Corporation, Armonk, NY --
Item [56], please add -- *Attorney, Agent or Firm* - Merchant & Gould; James R. Nock --

Signed and Sealed this

Twenty-eighth Day of May, 2002

*Attest:*

JAMES E. ROGAN
*Attesting Officer*   *Director of the United States Patent and Trademark Office*